United States Patent
Miller et al.

[11] Patent Number: 5,847,969
[45] Date of Patent: *Dec. 8, 1998

[54] INTEGRATED CIRCUIT DESIGN SYSTEM AND METHOD FOR GENERATING A REGULAR STRUCTURE EMBEDDED IN A STANDARD CELL CONTROL BLOCK

[75] Inventors: Brian C. Miller; Peter J. Meier, both of Fort Collins, Colo.

[73] Assignee: Hewlett-Packard Co., Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 641,660

[22] Filed: May 1, 1996

[51] Int. Cl.[6] .............................. G06F 17/00; G06F 17/50
[52] U.S. Cl. ........................ 364/491; 364/490; 364/489; 364/488
[58] Field of Search ..................................... 364/488–491, 364/578; 395/500

[56] References Cited

U.S. PATENT DOCUMENTS

| | | | |
|---|---|---|---|
| 5,457,410 | 10/1995 | Ting | 326/41 |
| 5,506,788 | 4/1996 | Cheng et al. | 364/491 |
| 5,519,627 | 5/1996 | Mahmood et al. | 364/488 |
| 5,537,580 | 7/1996 | Giomi et al. | 395/500 |
| 5,619,420 | 4/1997 | Breid | 364/491 |

*Primary Examiner*—Kevin J. Teska
*Assistant Examiner*—Vuthe Siek

[57] ABSTRACT

An improved system and method are provided for generating a design for a regular structure such as a memory array, multiplier array, or adder array embedded in a standard cell control block (SCCB). Once a net list has been generated for the SCCB by a logic synthesis tool, a special class of cells is created for the elements of the regular structure. The net list is modified via a special class mechanism by adding to the cells of the special class one or more special properties that are designed to optimize the placement of the cells of the regular structure. A modified placement and routing tool processes the modified net list by reading and interpreting the special properties so as to generate an improved design for the SCCB.

17 Claims, 4 Drawing Sheets

INTEGRATED CIRCUIT DESIGN SYSTEM AND METHOD FOR GENERATING A REGULAR STRUCTURE EMBEDDED IN A STANDARD CELL CONTROL BLOCK

FIELD OF THE INVENTION

This invention generally relates to the placement and routing of components that exhibit an irregular structure in an integrated circuit, and more particularly, to a system and method for optimizing the design of a standard cell control block with an embedded regular structure.

BACKGROUND OF THE INVENTION

Very large scale integration (VLSI) technology is often utilized to create semiconductor integrated circuits comprising thousands of logic elements and/or memory cells. VLSI circuits are fabricated on a silicon or sapphire wafer (i.e., substrate) and typically include a data path structure and a control structure. The data path structure processes words of data and comprises regular elements, such as memory arrays or multipliers. "Regular" means repetitive. Because of the regular or repetitive nature of the elements in the data path structure, the elements of the data path structure can be manually positioned on the wafer in an efficient manner, much like one would position pieces when putting together a jigsaw puzzle. The control structure, in contrast, controls the data path structure and comprises irregular elements, such as gates and latches. In addition, the control structure may include regular elements, such as small memory arrays, which are advantageously embedded in the control structure. The control structure is usually implemented as a standard cell control block (SCCB) made up of anywhere from one to several thousand standard cell elements. Because of the irregular nature of the elements of the SCCB, manual placement of the elements, as done with the data path structure, is not practical. Therefore, a placement and routing tool is utilized to create the art work, that is, the design, of the SCCB in the manner described below.

In general, with regard to generating the design of the SCCB, a net list is generated by a logic synthesis tool from a behavioral hardware description language (HDL) description. The net list is a listing of all the components and the connectivity of the components that comprise a block of logic. The net list is fed into a placement and routing tool, which generates the design of the SCCB therefrom. The resulting design designates the actual position and wiring of each component of the SCCB. The degree to which the placement of each component is optimized is a function of the design criteria of the placement and routing algorithm implemented by the placement and routing tool and the amount of central processing unit (CPU) time devoted to the operation of the placement and routing tool.

These algorithms are designed to minimize the routing capacitance in the SCCB by minimizing the routing lengths between connections. If the routing lengths are minimized, then the routing capacitive load is minimized, and the SCCB is faster, smaller (i.e., denser), and consumes less power, all of which are desirable attributes. Most conventional placement and routing algorithms achieve this optimization via an iterative, pseudo-random placement scheme. After an initial placement of the components, each component is considered for a move to see if the design can be better optimized by the move. The type of moves considered are usually either (1) swapping the position of a component with another randomly selected component, or (2) moving the position of a component to a randomly selected new location. The determination of whether or not the design can be optimized by the move is based upon a cost function. For example, the cost function may be the total wire length of the design, whereby the lower the total wire length, the more optimized the design. A calculation is done by the algorithm for each move to determine the change in the cost function caused by the proposed move. If the change is negative, thereby generating a new lower cost function, then the move is accepted and used as a new placement for the component under consideration for further iterations of the algorithm. Selecting only negative cost function changes is called a "greedy" algorithm.

A more advanced placement and routing algorithm, referred to as "simulated annealing", will occasionally accept moves producing a positive change in the cost function. In such cases, the simulated annealing algorithm will either accept or refuse the proposed move based upon the magnitude of a positive change, a decreasing value called the "temperature", and a random number so that the selection of the move is a probabalistic selection. Thus, a simulated annealing placement and routing algorithm performs design optimization via multiple iterations of a pseudo-random placement scheme modified by a temperature cost function. A detailed explanation of simulated annealing algorithms can be found, for instance, in Carl Sechen, "VLSI Placement and Global Routing Using Simulated Annealing," Chapter 2, Kluwer Academic Publishers, Boston, 1st Edition (1988), the disclosure of which is incorporated herein by reference.

While the methods described above and those known in the industry are adequate when placing and routing standard cell elements, such as gates and latches, in the SCCB, they have proven to be inadequate when placing and routing cell elements of a regular structure or array that is embedded in the SCCB. Simply stated, the gates and latches that typically comprise the SCCB have low fan-in and fan-out, whereas the elements of a regular structure or array that is embedded in the SCCB typically have relatively high fan-in and fan-out. Therefore, the added connections of the regular structure or array make for a more complex design that is not efficiently handled by the pseudo-random nature of conventional placement and routing algorithms. By way of comparison, a typical AND (or typical OR) gate will have two to three gates tied to its input and two to three other gates tied to its output. In contrast, a regular structure or array, such as a logic memory array, will have several elements that have up to ten or more connections. For instance, in a ten word by five bit memory array there are five bit lines, ten word lines, and ten dump lines. In such a memory array, all the dump and word lines are connected in each word of the array and all bit lines are connected in each bit of the array. As a result, each element is tied to fourteen other elements. Thus, the connectivity of the elements in the memory array is substantially greater than the connectivity of the gates and latches in an SCCB. Accordingly, the increased connectivity of regular structures tends to confuse or congest the operation of conventional placement and routing algorithms resulting in a less than optimal design for the regular structures embedded in an SCCB.

Further, with reference back to the example of the ten word by five bit memory array, an optimal design of such a memory array would have the dump and word connections and the bit connections orthogonal to one other. In such a design, the optimization of the dump and word connections and the optimization of the bit connections are contradicting design criteria in that optimizing one decreases the optimization of the other. For example, in order to reduce the routing capacitance of a word line, all the bits in that word are desirably placed as close as possible, thereby increasing the routing capacitance of the bit connections.

Thus, a heretofore unaddressed need exists in the industry for a system and method for optimizing the placement and routing of regular structures embedded in an SCCB so as to make the regular structures faster, denser, and more power efficient.

SUMMARY OF THE INVENTION

The present invention overcomes the deficiencies and inadequacies of the prior art as described hereinbefore. The present invention provides an improved integrated circuit design system and method for generating a design for a standard cell control block (SCCB) having a regular structure, such as a memory array, a multiplier array, or an adder array, embedded therein. Presently, when an SCCB requires a memory array (or similar regular structure), all the bit lines, all the word lines, and all the dump lines of the memory array are routed between the SCCB and the data path structure which slows up the operation of the chip and takes up valuable space in the routing channel. Alternatively, the memory array may be embedded and positioned within the SCCB by a pseudo-random placement and routing algorithm that is not capable of optimizing the design of the memory array because of its relatively high connectivity. The present invention, on the other hand, provide for optimum placement and routing of the components of a regular structure that are embedded in an SCCB. In addition, the present invention provides for the added optimization of the placement and routing of the other elements in the SCCB that are connected to and wrapped around the regular structure based upon the optimized design of the regular structure.

Briefly stated, the present invention improves on existing placement and routing systems and methods by providing for a special class of cells for the elements comprising a regular structure that is embedded in an SCCB. For each cell in the special class has one or more special properties are added in the net list. These special properties are subsequently read and interpreted by the placement and routing tool for optimization of the design of these elements in the SCCB.

In the preferred embodiment, the regular structure embedded in an SCCB is a memory array that comprises a plurality of cells. In this embodiment, the special property added to the net list for each cell of the memory array is a location property that provides an absolute physical position for that cell within the SCCB. However, it can be appreciated by one of ordinary skill in the art that other special properties can be defined and added in order to optimize the design of the SCCB to satisfy a particular design criteria.

For example, rather than designating the physical placement of a cell, the physical placement of a connection of a logic block can be designated in order the shorten a critical path. In this example, a connection might need to be made to another logic block above the logic block being designed. By placing the connection at the top of the logic block, the connection length to the other logic block will be minimized, and other cells in the logic block being placed will tend to be near the placed connection.

As a feature of the present invention, a special class mechanism is provided to pre-process the net list by adding a special property to the cells of the regular structure prior to sending the net list to a placement and routing tool. The special class mechanism essentially creates a special class of elements (i.e., cells in the preferred embodiment) that are associated with the regular structure embedded in the SCCB, and in doing so, modifies the net list by adding a special property to each cell in the special class. The special class mechanism can be configured to either select the cells from the net list that comprise the special class for modification, or alternatively, to receive a list of the cells in the special class for modification. Regardless of how the cells in the special class are identified, the special class mechanism adds or merges one or more special properties to the cells in the net list that are in the special class. In addition, the special class mechanism may also be configured to generate the particular property added to each cell. In addition, in the special class, or to receive the particular property for each element. In the preferred embodiment, the special class mechanism adds a special property to each cell of the net list that is in the special class which specifies the absolute physical position of each respective said cell.

As another feature of the present invention, the placement and routing tool is modified to read and interpret the special properties added to the net list by the special class mechanism. Specifically, in order to execute the present invention, the placement and routing tool needs to be able to read the special properties and to interpret the special properties. Preferably, the placement and routing tool is modified by adding additional lines of code to have the placement and routing tool look for the special property and to process the special property once read. As an example, the special property added in the preferred embodiment defines the physical position of each cell via a location property that may appear as "LOCATION X=__, Y=__", wherein the blanks are filled in with coordinates on the wafer die. When the modified placement and routing tool reads the special location property associated with a cell in the special class, the placement and routing tool places the cell in its designated location and will not move the cell from this location in subsequent iteration of the placement and routing algorithm.

The present invention also provides for and can be thought of as a method of generating a design of a regular structure that is embedded in an SCCB that comprises the following steps. Initially, once a net list has been generated from a behavioral HDL description by a logic synthesis tool, a special class of cells is created for elements that are associated with the regular structure embedded in the SCCB. The net list is then modified by adding a special property to each element in the net list that is in the special class identifying an absolute physical location of each said element. Lastly, a placement and routing algorithm that has been modified to read and interpret the special property is applied to the modified net list in order to generate an optimum design for the SCCB.

An advantage of the present invention is that it provides for a design of a regular structure embedded in an SCCB that maximizes element density in the regular structure.

Another advantage of the present invention is that it provides for a design of a regular structure embedded in an SCCB that minimizes routing capacitance.

Another advantage of the present invention is that it provides for a design of a regular structure embedded in an SCCB that enables the SCCB to operate faster.

Another advantage of the present invention is that it provides for a design of an SCCB that is optimized to a greater degree with regard to placement of the elements connected to and wrapping around the regular structure embedded therein.

Another advantage of the present invention is that it provides for an improved system and method for generating a regular structure embedded in an SCCB that is reliable, simple to implement, and efficient in operation.

Other features and advantages of the present invention will become apparent to one with ordinary skill in the art upon examination of the following drawings and detailed description. It is intended that all such additional features and advantages be included herein within the scope of the present invention, as defined by the appended claims.

BRIEF DESCRIPTION OF THE DRAWINGS

The present invention can be better understood with reference to the following drawings. The elements of the drawings are not necessarily to scale, emphasis instead is being placed upon clearly illustrating the principles of the present invention. Furthermore, like reference numerals designate corresponding parts throughout the several views.

DETAILED DESCRIPTION OF THE PREFERRED EMBODIMENT

I. Introduction

The following description is of the best presently contemplated mode of carrying out the present invention. This description is not to be taken in a limiting sense, but is made merely for the purpose of describing the general principles of the invention. Further, the present invention is not to be limited to the particular implementation of the preferred embodiment or to any particular implementation in software, firmware, hardware, or any combination thereof. Instead, the present invention can be easily implemented in any number of ways, but preferably it is implemented as software stored on a computer readable medium such as an electronic, magnetic, optional, or other physical device. The scope of the invention should be determined by referencing the appended claims.

Figure 1:
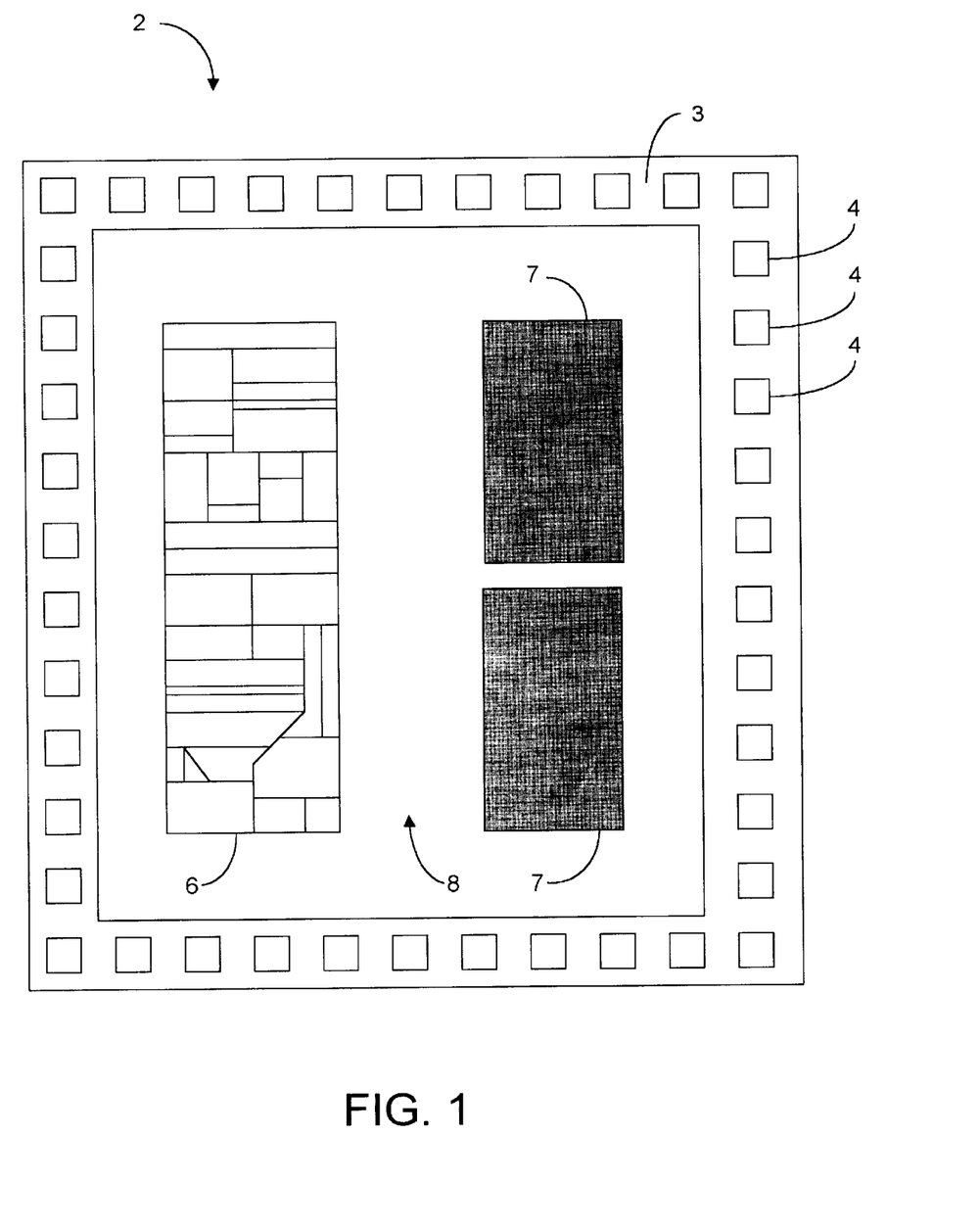
FIG. 1 is a top plan view of a very large scale integration (VLSI) circuit configured as a chip.

The present invention provides an improved integrated circuit design system and method for generating a design (i.e, art work) for a standard cell control block (SCCB) that has embedded in it a regular structure such as a memory array, multiplier array, or adder array. With reference to FIG. 1, an integrated circuit chip 2 comprising very large scale integration (VLSI) circuits is shown. The chip 2 includes a pad ring 3 that is disposed around the periphery of the chip 2 and that comprises a plurality of pads 4 to which gold wires are attached in packaging the chip 2. The integrated circuits that comprise the chip 2 can generally be divided into two types of structures, a data path structure 6 and a control structure 7.

The data path structure 6 includes elements such as multipliers, memory arrays, and adders that are relatively large and regular in structure. These elements are structurally regular in that they have repetitive configurations that are well known and easily optimized without the use of a placement and routing tool. Accordingly, the elements of the data path structure 6 are usually placed on the chip 2 manually because this can be done efficiently.

The control structures 7 comprise state machine or combinational logic formed from elements such as logical gates that fire the control lines into the data path structure 6. The state machines and combinational logic of the control structure 7 are irregular and are conventionally implemented as a standard cell control block (SCCB). For purposes of the present disclosure, an SCCB is a logic block comprising elements from a standard cell library of logic gates, registers, and latches. The SCCB typically controls a data path structure, but may in some cases provide all the required functionality of a design.

The control structure 7 is considered an irregular structure in that its design is humanly incomprehensible. Accordingly, the SCCB is designed utilizing a computer program that incorporates a placement and routing algorithm such as simulated annealing or greedy.

With reference back to FIG. 1, the data path structure 6 and the control structure 7 are physically separated by a routing channel 8 across which all the connections between the data path structure 6 and the control structures 7 are made. The width of the routing channel is most impacted by the number of connections being made, the more connections, the wider the routing channel 8. When the routing channel 8 is made wider, then the connections have a farther distance to travel which results in greater routing load, slower speed, and greater area requirements. Therefore, it is advantageous to embed certain regular structures in the control structure 7 in order to minimize channel connections, thus optimize the design of the chip 2. However, as mentioned above in the Background section, the conventional placement and routing algorithms utilized to design an SCCB are inadequate (i.e., inefficient) when generating a design for SCCB with a regular structure embedded therein.

Accordingly, the following discussion of the present invention provides an improved system and method for generating an optimized design of an SCCB with an embedded regular structure.

II. Architecture

Figure 2:
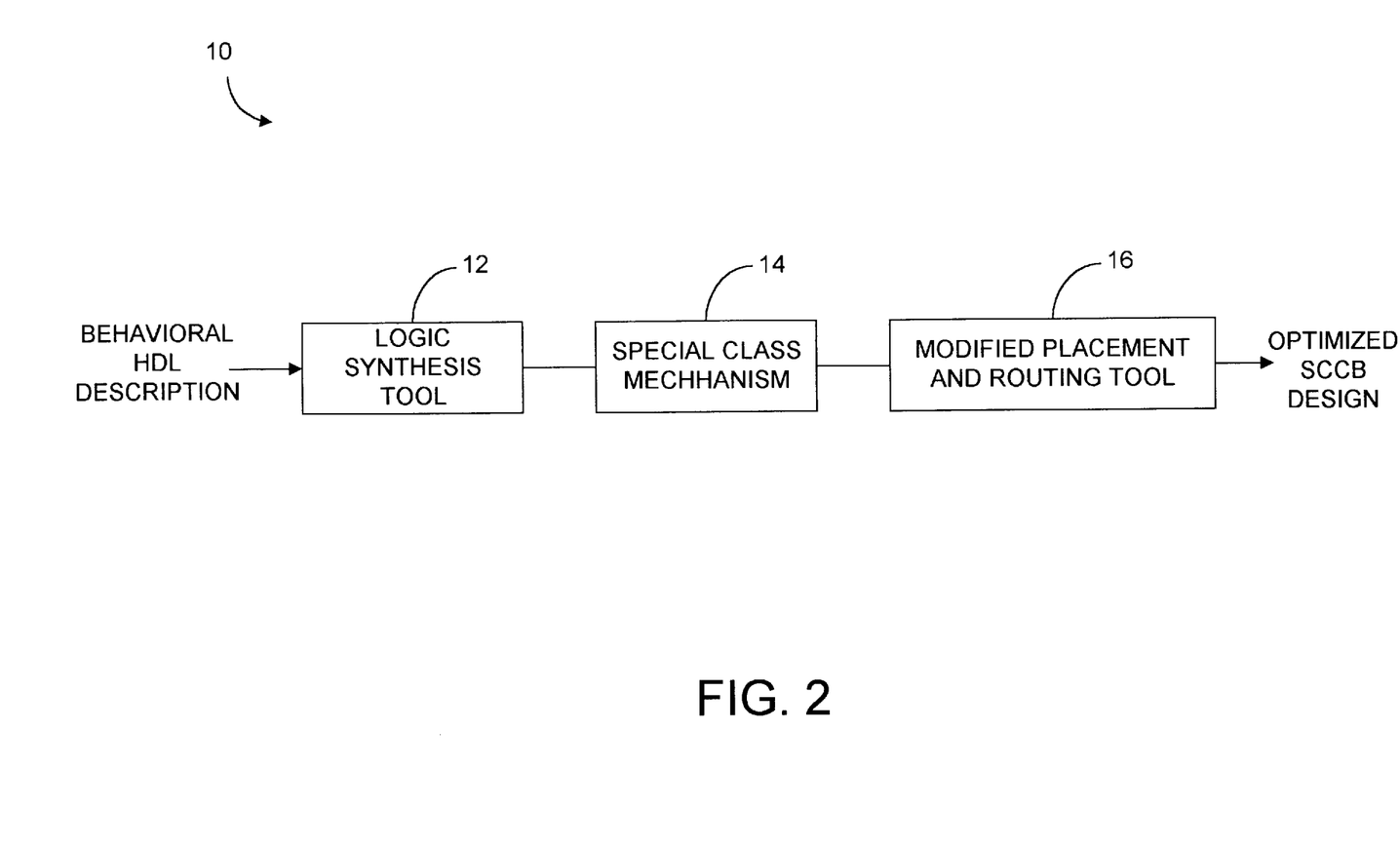
FIG. 2 is a block diagram of a system for generating a design for VLSI circuits from a behavioral hardware description language (HDL) description in accordance with the present invention.

With reference now to FIG. 2, an improved integrated circuit design system 10 for generating an optimized design of an SCCB with an embedded regular structure in accordance with the present invention is illustrated. A behavioral hardware description language (HDL) description, as is commonly used in high-level VLSI designs, is provided to a logic synthesis tool 12 for the creation of a net list. For purposes of the preferred embodiment, the logic synthesis tool utilized is SYNOPSIS®, sold by Synopsis, Inc. California, U.S.A., though any suitable logic synthesis tool may be utilized. The net list generated by the logic synthesis tool 12 is a list of the cells or elements comprising the SCCB and the connectivity of those cells. Although the particular syntax of the net list may vary dependant upon the logic synthesis tool 12 utilized, the generally followed format of a net list includes the name of each cell followed by various properties defining that cell such as listing the names of the signals to which the cell is connected, and the cell's physical size.

A special class mechanism 14 then receives the net list from the logic synthesis tool 12 for pre-processing of the net list before the net list is sent to a modified placement and routing tool 16. The special class mechanism 14 creates a special class of cells for the elements that are a part of a regular structure embedded in the SCCB. For instance, in the preferred embodiment, the regular structure is a small memory array that is embedded within the SCCB because the memory array is relatively small and it would not be efficient. Specifically, placing the memory array in the data path structure 6 is generally not desirable because all the bit lines and set lines from the SCCB would have to be routed across the routing channel 8 to the data path structure 6, and as a consequence, the operation of the chip 2 is slowed down and a large portion of the routing channel 8 is used. Thus, prior to the present invention, the foregoing logic was to generate the memory array in the SCCB via the pseudo-random scheme of conventional placement and routing algorithms. However, as previously discussed, this also results in a less than optimal design because, inter alia, even a small memory array contains numerous connections that are physically orthogonal (i.e., the connection of the word and bit lines are optimized when orthogonal) and this added complexity confuses the pseudo-random scheme of conventional placement and routing tools. Accordingly, the resulting designs of the regular structures are sparse and have relatively high routing capacitance.

In order to overcome this problem, the special class mechanism 14 creates a special class of cells for those that are part of a regular structure embedded in the SCCB. The special class mechanism 14 then modifies the net list with one or more special properties for each cell in the special class so as to control the manner in which the placement and routing tool 16 processes the cells in the special class.

In the preferred embodiment, the regular structure is a memory array that is optimized in design when its elements are placed together as close as possible with the set lines and bit lines orthogonal to one another. Accordingly, the net list entry for each cell in the memory array is modified by the addition of a special location property that provides an absolute physical position for that cell. The special property added to the net list is preferably written as "LOCATION X=(actual x coordinate), Y=(actual y coordinate)." In addition, the placement and routing tool is modified in the manner described below so that the cells with a special location property in their designated position and not to be repositioned in subsequent interactions of the placement and routing algorithm.

Further, the special class mechanism 14 can also be configured to calculate the absolute physical position of each cell that is provided by the location property. However, because of the complexity involved in placing cells of a memory array, it is generally more efficient for the physical locations to be calculated manually and provided to the special class mechanism 14. The position of each cell is preferably calculated to maximize the density of the memory array and to minimize the routing capacitance load. The special class mechanism 14 then adds or merges the special location property of each cell in the special class with its listing in the net list.

In regard to other embodiments, it has been conceived by the inventor and is within the scope of the present invention to have the special class mechanism 14 calculate or provide other functional features as defined by the user to achieve a specific design criteria. For example, the special class mechanism 14 may create a special class of connections and add a new special property that provides the absolute physical position for each connection in the special class. This may be desirable when it is known that the data out of a memory array is a critical path, and therefore, the user is justified in optimizing the routing capacitance on the bit lines at the expense of the routing capacitance of the word lines. It can further be appreciated by one of ordinary skill in the art that more than one special class can be implemented by the special class mechanism 14 in a single net list, whereby, each special class performs a different functionality with regard to the design of the SCCB.

Referring back to FIG. 2, the modified net list is then transferred from the special class mechanism 14 to the modified placement and routing tool 16 where a placement and routing algorithm generates the art work, that is, the design, of the SCCB. The modified placement and routing tool 16 can be implemented by any suitable placement and routing algorithm, but preferably, by a simulated annealing algorithm that is modified in order to be able to read and interpret the special property added to the net list by the special class mechanism 14. Accordingly, in the first pass of the algorithm, the algorithm identifies each cell with a special location property and places that cell in its designated location. In each subsequent pass of the algorithm, the algorithm checks each cell for a special location property before that cell is included in a move. If a cell has the special location property, then that cell is not included in any proposed move, and its placement is forced back in to the location specified by its special location property. Replacing the cell at the specified location is important since it might have moved based upon the movement of other cells.

Moreover, the placement and routing algorithm can be modified to read and interpret other special properties customized so that the present invention can be utilized to optimize the design of any logic block based on a user's criteria via the present invention. For example, in regard to the design criteria of the preferred embodiment where the regular structure is a memory array, the optimized design places the cells of the array as close as possible. This makes the memory array as small as possible so that the SCCB is denser and the routing capacitance is reduced, thereby enabling the SCCB to operate faster and consume less power.

A feature of the present invention is that once all the cells of the special class have been placed, the cells of the SCCB that are connected to the regular structure can be placed in the normal operation of the modified placement and routing tool 16 near or adjacent the regular structure so as to optimize their placement. This feature of the present invention further optimized the design of the SCCB so as to provide a faster, denser, and more power efficient chip 2.

Worth noting at this point is that the logic synthesis tool 12, the special class mechanism 14, and the modified placement and routing to 16 of the integrated circuit design system 10 can be configured as software modules and stored on any computer readable medium for use by or in connection with a computer related system or method. For example, the aforementioned software modules can be stored in a memory of a computer system and executed by a processor of the computer system in order to create a special purpose computer system for designing VLSI circuits. The processor and memory are typically interconnected via a system interface such as a bus. In such a computer system, the behavioral HDL description is inputted via an input device and processed by said software modules in substantially the same manner as described herein. The output is an optimized design that can be displayed on a display device associated with the computer system and/or outputted via an output port or device to a print or other suitable device.

III. Operation

The preferred operation and sequence of events corresponding with the integrated circuit design system 10 for generating an optimized design of an SCCB with an embedded regular structure and the associated methodology are described hereafter.

Figure 3:
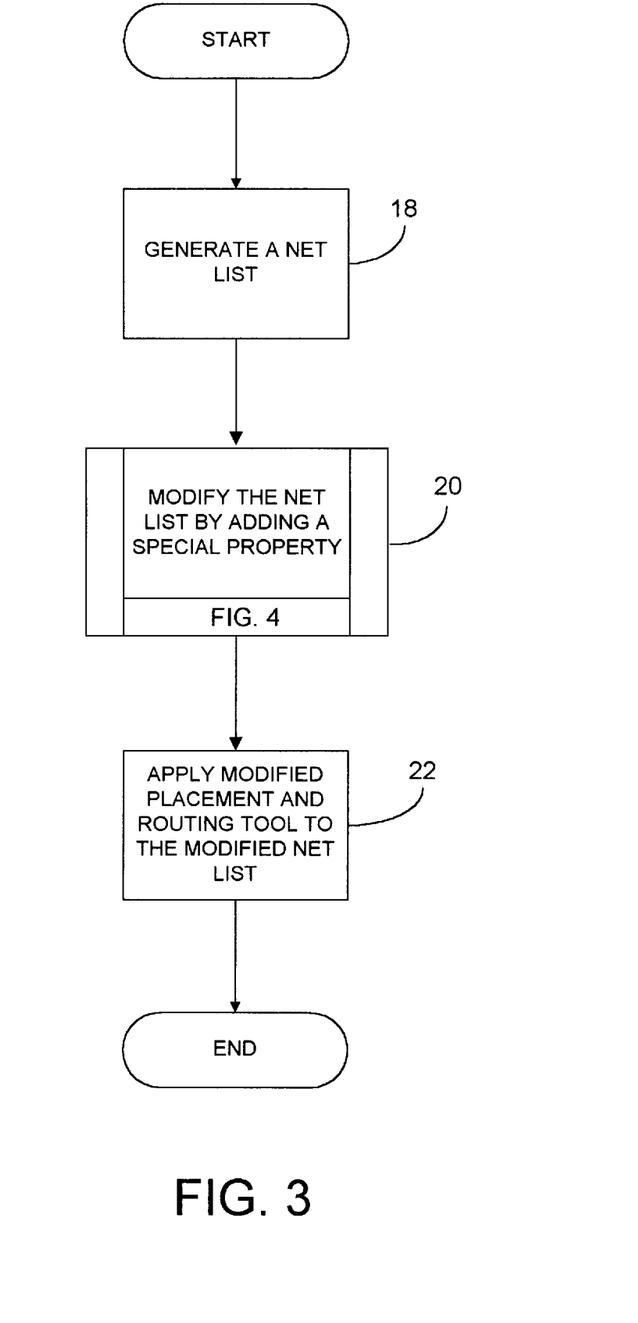
FIG. 3 is a flow chart of the operation of the system of FIG. 2.

With reference to FIG. 3, a net list comprising a listing of the cells for implementing the SCCB is initially generated, as indicated at block 18. As discussed above, this step is preferably performed by the logic synthesis tool 12 which converts a behavioral HDL description into the net list.

Next, at block 20, the net list is modified with a special property. Specifically, a special class is created for the cells in the net list that are associated with the regular structure embedded within the SCCB. The entry of each cell that is in the special class is modified to include one or more special properties. Particularly, in the preferred embodiment, a special location property that designates an absolute physical location is added to each cell in the special class. A more detailed discussion of the modification of the net list with regard to the preferred embodiment of the present invention is provided below with reference to FIG. 4.

A modified placement and routing tool is then applied to the modified net list, as indicated at block 22. Because the net list has been modified to include a special property for the cells in the special class, the placement and routing tool 16 is likewise modified in order to be able to read and interpret the special property. The modified placement and routing tool 16 then processes the net list by placing the cells of the special class at their designated physical locations provided by their added special location property. This is done in the first pass of the algorithm. In subsequent passes of the algorithm, when the algorithm is considering each cell of the SCCB for one or more proposed pseudo-random moves, the algorithm first checks each cell for a special location property. If a special location property is associated with a cell, that cell is not included in the proposed move and is forced back into the location specified by the location property. Thus, the algorithm of the modified placement and routing tool 16 generates optimized design for the SCCB, including an optimized configuration for the regular structure embedded therein. Further, an added feature of the present invention is the serendipitous optimization of the placement of the cells in the SCCB that connect to and wrap around the regular structure based upon the known optimized location of the cells in the regular structure.

Figure 4:
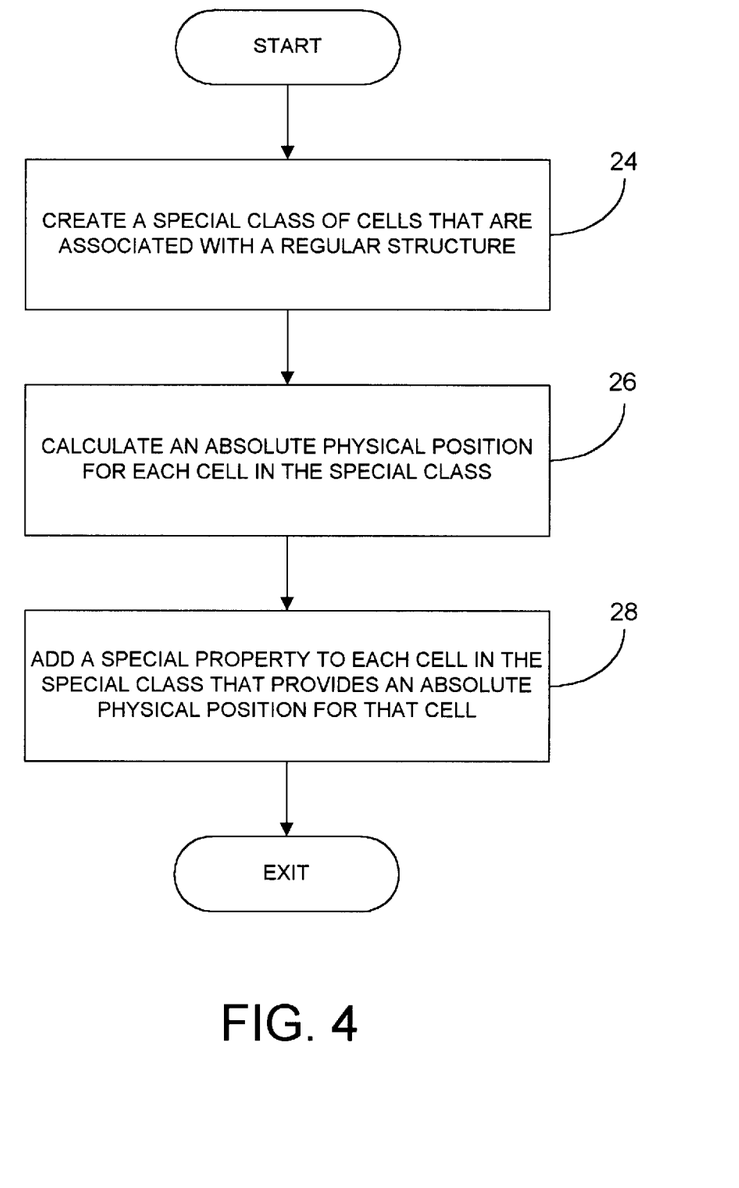
FIG. 4 is a flow chart of the modification of the net list in accordance with the present invention.

With reference now to FIG. 4, the steps of modifying the net list with regard to the preferred embodiment are provided. Initially, a special class of cells is created for the cells associated with the memory array (i.e., the regular structure) embedded in the SCCB as indicated at block 24. This step can be performed manually or automatically by the special class mechanism 14. In either case, the special class is created. Next, at block 26, the absolute physical position of each cell in the special class is calculated. This step can be performed manually by the user in substantially the same manner the elements of the data path structure are located, or automatically by the special class mechanism 14. In the preferred embodiment, the cells of the memory are preferably positioned as close as possible in order to reduce the routing capacitance and increase density. Further, the word lines and bit lines are preferably physically orthogonal for increased optimization.

At block 28, a special property referred to as a location property is added to the net list for each cell in the special class. This special location property designates the absolute physical position of the respective cells as calculated at block 26. The location property is preferably added or merged with the net list by the special class mechanism 14 so that an addition property, i.e., the location property, is included with the other properties of each respective cell in the special class. This added location property is subsequently read and interpreted by a modified placement and routing tool 16 when processing the modified net list in accordance with the present invention as discussed above with reference to FIG. 3.

In concluding the detailed description, it should be noted that it will be obvious to those skilled in the art that many variations and modifications may be made to the preferred embodiment without substantially departing from the principles of the invention. All such variations and modifications are intended to be included herein within the scope of the present invention, as set forth in the following claims. Further, in the claims hereafter, the structures, materials, acts, and equivalents of all means or step plus function elements are intended to include any structures, materials, or acts for performing the recited functions in combination with the other claimed elements as specifically claimed.

Wherefore, the following is claimed:

1. A method for generating a design for a standard cell control block with a regular structure embedded in the standard cell control block, comprising the steps of:

generating a net list for said standard cell control block that includes a plurality of cells and a connectivity of each said cell;

modifying said net list by adding a special property to a special class of cells, each said cell made up of cells that are associated with said regular structure embedded in said standard cell control block, said special property providing an absolute physical position on a wafer die to each cell for each cell in said special class;

processing said modified net list with a placement and routing algorithm to generate an optimized design for said standard cell control block; and preventing said placement and routing algorithm from repositioning cells in said special class from positions provided by said special property.

2. The method of claim 1, wherein said step of modifying said net list includes the step of selecting cells from said net list that are associated with said regular structure embedded in said standard cell control block.

3. The method of claim 1, wherein said step of modifying said net list includes the step of calculating an absolute position on a wafer die for each said cell in said special class.

4. The method of claim 1, wherein said placement and routing algorithm is a simulated annealing algorithm.

5. The method of claim 1, wherein said step of modifying said net list includes the step of manually calculating an absolute physical position on a wafer die for each said cell in said special class.

6. A method for generating a standard cell control block design, comprising the steps of:

generating a net list representative of a plurality of elements;

calculating an absolute physical position on a wafer die for at least one element of said plurality of elements of said net list;

modifying said net list by adding said position to said net list as a special property associated with said at least one element;

applying a placement and routing algorithm to said modified net list so that said at least one element is placed at said position; and preventing said placement and routing algorithm from repositioning said at least one element from said absolute physical position provided by said special property.

7. A method of claim 6, further including the steps of reading said absolute position and placing said element at said absolute position.

8. The method of claim 6, wherein said element is associated with a regular structure embedded in said standard cell control block.

9. The method of claim 6, wherein said at least one element is a logic memory cell.

10. The method of claim 6, wherein said at least one element is a connection.

11. The method of claim 6, wherein said step of calculating an absolute physical position is performed manually.

12. A system for generating an optimized design of a standard cell control block having a regular structure is embedded therein, the system comprising:

a special class mechanism for creating a special class of cells within said net list that comprises cells associated with said regular structure that are embedded in said standard cell control block, each said cell in said special class having a special property designating an absolute physical position on a wafer die for that said cell;

whereby said special class mechanism modifies said net list so that a placement and routing algorithm can process said modified net list to generate an optimum design for said standard cell control block; and wherein said placement and routing algorithm is prevented from repositioning cells in said special class from said absolute physical positions provided by said special property.

13. The system of claim 12, further comprising a logic synthesis tool for generating said net list for said standard cell control block that includes a plurality of cells and a connectivity of each said cell.

14. The system of claim 12, wherein said special class mechanism includes means for selecting said cells in said net list associated with said regular structure.

15. The system of claim 12, wherein said special class mechanism includes means for calculating an absolute physical position of a wafer die for each said cell in said special class.

16. The system of claim 12, wherein said special class mechanism includes means for adding said special property to existing properties in said net list associated with said cells in said special class.

17. The system of claim 12, wherein said special class mechanism is stored on a computer readable medium.

* * * * *